United States Patent [19]
Horn

[11] Patent Number: 5,278,565
[45] Date of Patent: Jan. 11, 1994

[54] APPARATUS FOR SETTING INDIVIDUAL DIFFERENT ELECTRONIC DEVICES OF AN EQUIPMENT SYSTEM

[75] Inventor: Wolfgang Horn, München, Fed. Rep. of Germany

[73] Assignee: Rhode & Schwarz GmbH & Co. KG, Fed. Rep. of Germany

[21] Appl. No.: 861,766

[22] Filed: Apr. 1, 1992

[30] Foreign Application Priority Data

Apr. 6, 1991 [DE] Fed. Rep. of Germany ....... 4111181

[51] Int. Cl.⁵ .......................... G01S 7/40; G05B 23/02
[52] U.S. Cl. .................................... 342/165; 364/139; 364/571.01; 364/579
[58] Field of Search ................... 342/27, 59, 165, 175; 364/139, 550, 579, 571.01

[56] References Cited

U.S. PATENT DOCUMENTS

| | | | |
|---|---|---|---|
| 4,947,355 | 8/1990 | Koeman | 364/571.01 |
| 5,115,407 | 5/1992 | Bird et al. | 364/551.01 |
| 5,122,801 | 6/1992 | Hughes | 342/13 |

*Primary Examiner*—Mark Hellner
*Attorney, Agent, or Firm*—Hill, Steadman & Simpson

[57] ABSTRACT

In an apparatus for setting individual different electronic devices of an equipment system for measuring or detecting the properties of a selected object, a control computer is provided for cooperating with a device memory and an object memory. The device memory stores therein the individual devices of the system with their technical properties and their settable functions, while the object memory stores therein. The various object types with their properties. The control computer is configured such that, prior to performing an object measurement or detection, all object types with their properties and also the possible ways of display of these object properties are initially displayed on the screen of the control computer and the user may select therefrom the type of object to be measured or detected and the desired way(s) of displaying said properties. The control computer is furthermore operatively connected to the individual devices such that, after selection of the object type of interest and the desired way(s) of display, the control computer automatically selects the suitable devices of the system, performs the required settings thereof, and subsequently performs the desired measurement or detection.

9 Claims, 9 Drawing Sheets

APPARATUS FOR SETTING INDIVIDUAL DIFFERENT ELECTRONIC DEVICES OF AN EQUIPMENT SYSTEM

BACKGROUND OF THE INVENTION

1. Field of the Invention

The present invention relates to an apparatus for setting individual different electronic devices of an equipment system, for instance a plurality of radio detection devices of a radio detection system or measuring devices of a measuring system.

2. Description of the Prior Art

In various technical fields an ever increasing number of different electronic devices are combined to form an overall system which is able to perform the most varied tasks of detection or measurement. For example in the field of radio detection, equipment systems are used in which a plurality of different direction finders operating at different frequencies and along different principles are combined with search receivers and monitoring receivers. Such a universal radio detection system is capable of performing the most varied tasks of radio detection. It is common practice, for instance in the field of electronic measurements, to combine the most varied electronic measuring instruments at a single point of measurement, for instance voltmeters, ammeters, generators, analyzers and the like, so that the most varied devices under test may be measured at such a universal point of measurement. All of these systems exhibit the drawback that selecting and setting of the increasingly complicated electronic devices is quite beyond the user's powers.

To facilitate the setting of individual electronic measuring devices it is known to use a control computer which indicates to the user the various possibilities of measurement offered by the measuring device and how the user should set or adjust these possible measuring operations in the measuring device (DE 3,208,136). Although this facilitates the operation of such measuring devices, the user must still perform successive setting operations on the measuring devices, and to this end he must work out for every device to be measured the corresponding parameters to be measured and the display modes.

SUMMARY OF THE INVENTION

It is therefore an object of the present invention to provide an apparatus which allows even unskilled users the ready setting of such a system composed of plural different electronic devices so that a specific task can be performed.

In accordance with the invention, an apparatus for setting individual electronic devices of an equipment system for measuring or detecting properties of a selected object, a control computer means is provided cooperating with a device memory and a select-object memory, the control computer means having a display screen. The individual electronic devices of the system including technical properties thereof and settable functions thereof are stored in the device memory, and various types of objects including technical properties thereof are stored in the select-object memory. The control computer means, prior to performing a desired measurement or detection of an object, initially displays on the display screen object types and technical properties thereof and also possible way or ways of displaying these object properties so that a user may select therefrom a desired type of object top be measured or detected and a desired way or ways of displaying technical properties thereof. The control computer means is operatively connected to the individual electronic devices such that, after selection of the desired type of object and the desired way or ways of displaying the technical properties, the control computer means automatically selects appropriate electronic devices of the system, automatically makes a required setting thereof, and subsequently automatically causes the desired measurement or detection to be performed.

An apparatus according to the invention allows even unskilled users to correctly set complicated systems of electronic devices in a simple manner without requiring the user to be acquainted with the details of the devices and their possible settings. For the operation and setting of an apparatus according to the invention the user need only know the results desired by him, and everything else will be executed automatically by the apparatus. For example, the user of a radio detection system merely has to imagine a graphic representation of a spectrum display (panorama display) which indicates to him the occupancy of a frequency band by transmitters of a given type. Further, the user may possibly imagine a map of a predetermined area with the positions of these transmitters plotted thereon. Then, the user only has to select the panorama display and the position finding result, and the apparatus according to the invention will automatically set the instruments of the radio detection system. In the same way, the measurement technologist may for instance imagine the test report desired by him including certain diagrams about attenuation and group delay characteristics within a certain band of frequencies before he provides a certain device under test to a measuring system with different electronic measuring instruments. In this case, too, the measurement technologist only has to feed the apparatus with the test results desired by him, and the apparatus will fully automatically set the measuring instruments required for said test result and supply the desired result automatically. It is also possible for a measurement technologist, prior to starting a measuring operation, himself to cause the desired diagram or even plural such diagrams to be displayed on the screen, to provide the respective coordinate axes with the proper parameter legends, and to scale them to the parameter ranges of interest. This is facilitated when the measurement technologist inputs the type of device under test so that the apparatus can relieve him of this work. In this way the conversion of a certain desired test result to the choice of the proper measuring instruments and their respective proper setting becomes very simple even with extremely complex measurement systems having numerous measuring functions, because the user is not required to know any details about the measuring instruments and their functions. Therefore an apparatus according to the invention considerably facilitates the operation of complicated equipment systems, and the setting times may also be considerably shortened thereby. The apparatus according to the invention is not only suited for radio detection systems or measuring systems but it may analogously be used with the same advantages for the setting of individual electronic devices of a combined equipment system to perform any kind of measurement or detection tasks for any desired objects under test.

An apparatus according to the present invention is readily implemented in practice, because most electronic devices comprise corresponding connections for remote control; for instance all devices such as direction finders, search receivers and the like for radio detection comprise in addition to the front-side setting means also rear ports for remote control, and the same applies to modern electronic measuring instruments which also include corresponding ports for remote control. It is therefore merely necessary properly to link these remote control ports of the electronic devices to the control computer so that the control computer can automatically perform the desired setting of the devices. The principle underlying the invention can be used not only with systems composed of individual electronic devices, but in the same way it may be used with equipment systems which—integrated in a single device—are capable of performing the most varied tasks of detection or measurement, for instance complicated radio detection devices or measuring devices which can be switched to various different operating modes.

BRIEF DESCRIPTION OF THE DRAWINGS

Other objects, features and advantages of the invention, its organization, construction and operation will be best understood from the following detailed description taken in conjunction with the accompanying drawings.

DESCRIPTION OF THE PREFERRED EMBODIMENTS

Figure 1:
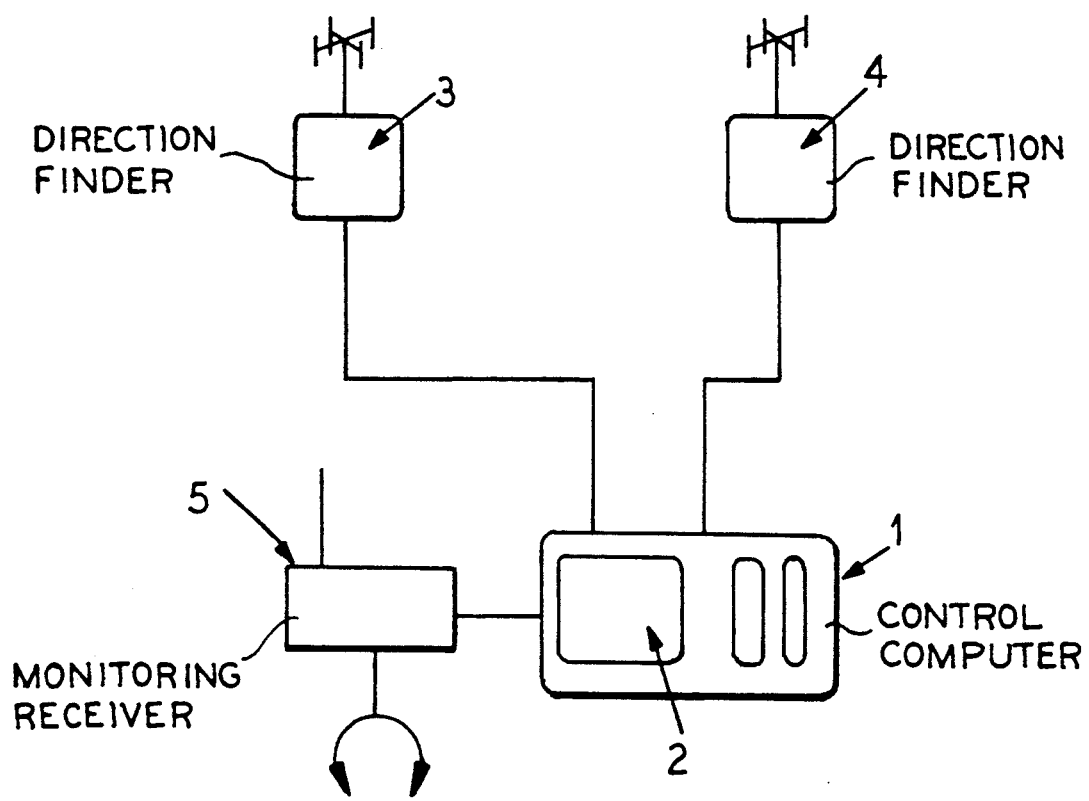
FIGS. 1 to 6 illustrate an apparatus according to the invention as applied to a radio detection system.

FIG. 1 illustrates the basic design of a radio detection system comprising plural direction finders 3 and 4 and a monitoring receiver 5. These electronic devices 3 to 5 are operatively linked with a control computer 1 and are adapted to be remote-controlled. The control computer comprises a normal user surface with a screen 2, details will be evident from FIG. 2. The control program 8 of the computer 1 makes use of a graphic, window-oriented user surface 9 of the type commonly used in modern computers for presenting information to the user and asking him for information and decisions.

These windows may be opened when the user clicks on a field in the table bearing the name of the window, whereupon this display field is presented by the control program 8. Simultaneously, these windows may be activated for outputting current measurement results when the user positions the cursor on the window frame and depresses the key "display field". Either simultaneously or alternatively, the windows may also be used for displaying earlier measurement results.

To the user, the user surface 9 offers a cursor control 11 by means of which he may move a cursor 10 across the screen. This cursor, which under normal conditions points to a location on the screen, may be "unfolded" in a usual manner so that it indicates all points within a frame instead of a single point. A corresponding example is shown by the surface 23 in FIG. 2. Graphic elements to which the cursor points may now be selected with the keys "select" 12, "measuring range" 14, "display range" and "analysis range".

Also, the computer 1 includes three associated memories 16 to 18, viz. a type of transmitter memory 16, a detection device memory 17 and a result memory 18.

The detection device memory 17 stores the individual radio detection devices 3 to 5 which cooperate with the system with their technical data and their settable radio detection functions, such as for example:

| Detection Device: | System | Direction Finder | Monitoring Receiver |
|---|---|---|---|
| parameter position: | | | |
| minimum East longitude: [°] | 8 | | |
| maximum East longitude: [°] | 10 | | |
| minimum North latitude: [°] | 50 | | |
| maximum North latitude: [°] | 51 | | |
| parameters required: | azimuth of DF's 3 and 4 in synchronism | | |
| parameter frequency: | | | |
| minimum frequency: [MHz] | | 20 | 2 |
| maximum frequency: [MHz] | | 200 | 1000 |
| minimum resolution: [kHz] | | 1 | 0.10 |
| maximum setting time: [s] | | 1.00E-3 | 1.00E-2 |
| bandwidths: [kHz] | | 7.50 | 2.70 |
| | | 15 | 8 |
| | | 150 | 15 |
| | | | 250 |
| | | | 1000 |
| parameters required: | | none | none |
| parameter level: | | | |
| modulation modes: | | all | all |
| measuring time: [s] | | 2.00E-3 | 2.00E-3 |
| parameters required: | | frequency | frequency |
| parameter azimuth: | | | |
| modulation modes: | | all | |
| measuring time: [s] | | 0.10 | |
| parameters required: | | frequency | frequency |
| parameter content: | | | |
| modulation modes: | | | AM, FM, USB, LSB manual |
| measuring time: [s] | | | |
| parameters required: | | frequency | frequency |

Inputting of these data into the memory 17 is performed on the basis of the specification sheets of the manufacturer of these devices.

The memory 16 for the type of transmitter stores therein the transmitter types that can be detected with the radio detection system together with their detectable parameters, such as for example:

| Detectable Parameters for all Transmitter Types: | | | | |
|---|---|---|---|---|
| position: | | yes | | |
| frequency: | | yes | | |
| level: | | yes | | |
| azimuth: | | yes | | |
| content: | | yes | | |
| transmitter type: | unit | type 1 | type 2 | type 3 |
| technical characteristics: | | | | |
| min. operating frequency: | [MHz] | 1.50 | 26 | 30 |
| max. operating frequency: | [MHz] | 30 | 46 | 88 |
| min. frequency step: | [kHz] | 0.10 | 12.50 | 25 |
| bandwidths: | [kHz] | 0.15 | 8 | 8 |
| modulation modes: | | AM, USB, LSB | AM, FM | FM |
| transmitter type: | | type 4 | type 5 | type 6 |
| technical characteristics: | | | | |
| min. operating frequency: | [MHz] | 88 | 116 | 225 |
| max. operating frequency: | [MHz] | 107 | 156 | 400 |
| min. frequency step: | [kHz] | 75 | 12.50 | 25 |
| bandwidths: | [kHz] | 75 | 8 | 12 |
| modulation modes: | | FM | AM | FM |
| transmitter type: | | type HF | type V | type U |
| technical characteristics: | | | | |
| min. operating frequency: | [MHz] | 2 | 30 | 200 |

-continued

| | | | | |
|---|---|---|---|---|
| max. operating frequency: | [MHz] | 30 | 200 | 1000 |
| min. frequency step: | [kHz] | 0.10 | 12.50 | 12.50 |
| bandwidths: | [kHz] | 0.10 | 12.50 | 12.50 |
| modulation modes: | | all | all | all |

The data for the transmitter type memory 16 are initially derived from the manufacturers' specifications and transferred to the file, but they may also be generated with the aid of the control program and the displays if, for instance, the user in a desired display "panorama" uses the cursor 10 in the normal way to define a parameter range 24 and depresses key 13 "transmitter type", whereupon the control program packs a new data record in the transmitter type memory 16 whose parameters "minimum frequency" and "maximum frequency" correspond to the left-hand and right-hand limit of the parameter range 24.

By means of the specifications of the actually non-existent transmitter types HF, V and U the user is able to define tasks with which an entire frequency band can be tested completely.

Start of Operation

Figure 2:
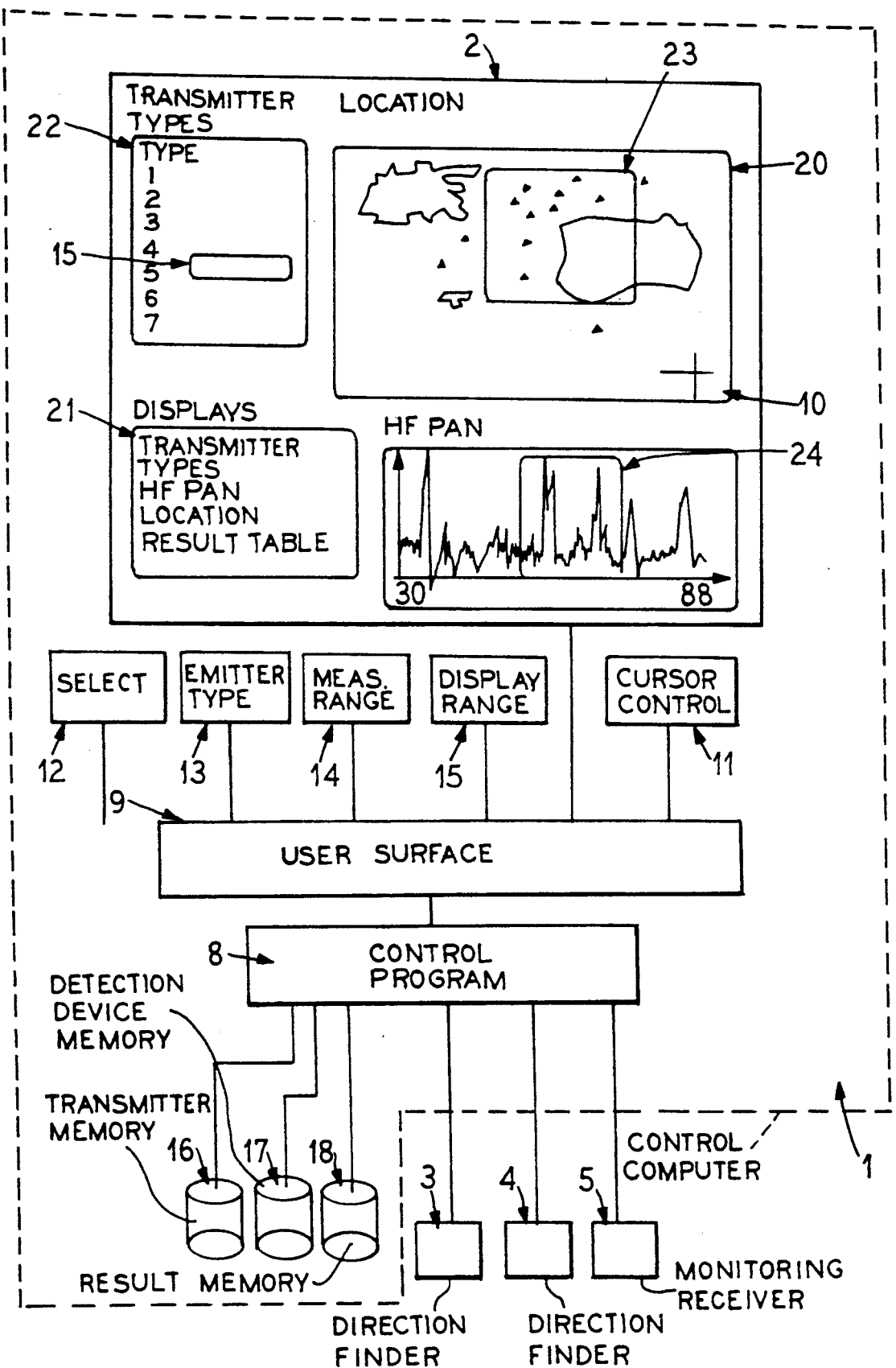
Figure 3:
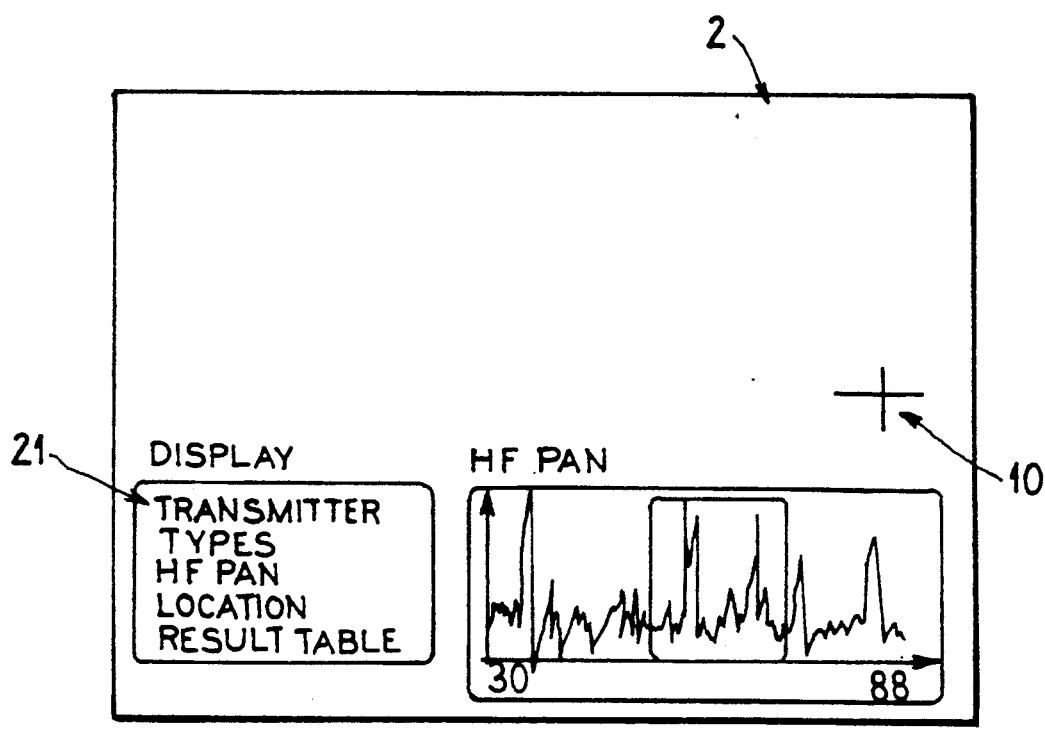

At the start of operation the control program 8 presents a screen as illustrated in FIG. 2 and indicates in window "displays" 21 what display windows are available, for example:
"transmitter types" for selection and display of transmitter types,
"position" for display of the parameter "position",
"H.F. panorama" for indicating the parameter "level" as dependent on the parameter "frequency",
"result file" for selecting measured values filed in the result memory.

In this example, when the user clicks on the line with the name "transmitter type" in the window "displays" 21, the control program 8 reads out the content of the transmitter type-memory 16 and displays the names of the transmitter types in the display window "transmitter types" 22.

Figure 4:
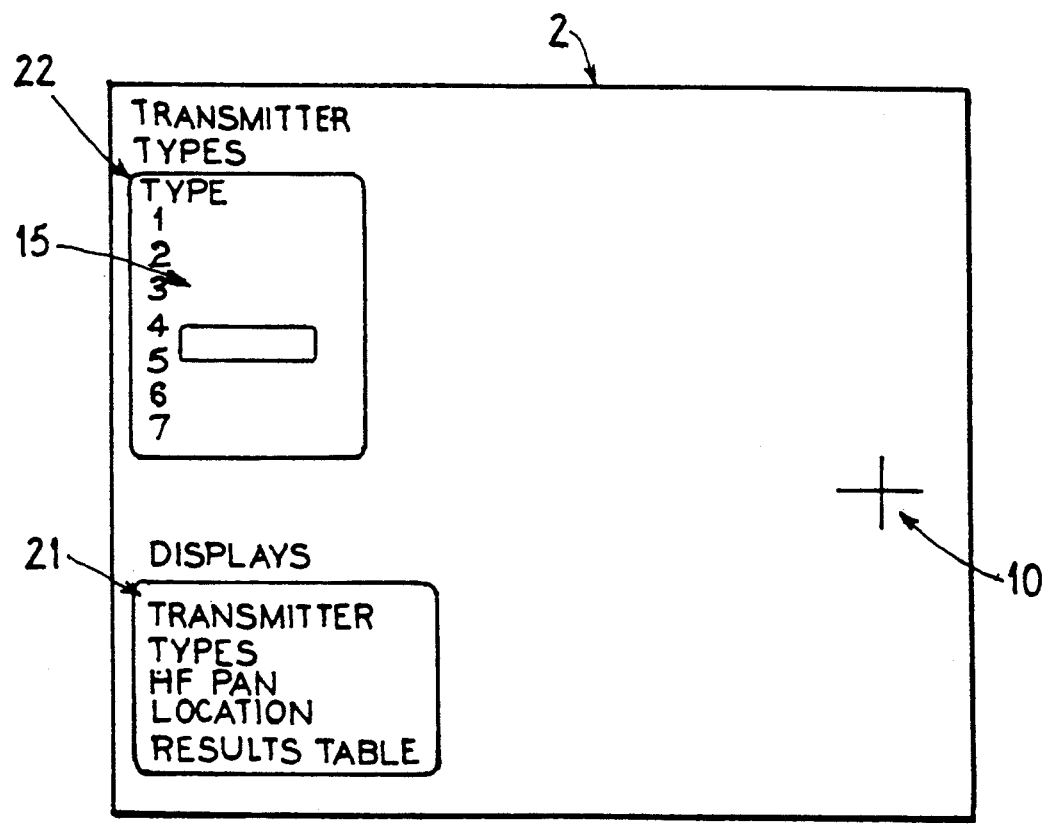

When, as illustrated in FIG. 4, the user in said display window 22 clicks on the transmitter type he wishes to detect, for instance the transmitter type 3, and when he depresses the key "measurement range" 14, the control program 8 discriminates that the user wants to limit the measurement range to this transmitter type.

Selection of the Transmitter Type to be Detected

When the user has limited the range of measurement to the transmitter type 3, the control program 8 reads from the transmitter type-memory 16 the detectable parameters and parameter limits of this transmitter type:

| Detectable parameters: | | |
|---|---|---|
| position: | | yes |
| frequency: | | yes |
| level: | | yes |
| azimuth: | | yes |
| content: | | yes |
| Technical characteristics: | | |
| min. operating frequency: | [MHz] | 30 |
| max. operating frequency: | [MHz] | 88 |
| min. frequency step: | [kHz] | 25 |
| bandwidths: | [kHz] | 8 |
| modulation modes: | | FM |

This selection pre-defines the measurement ranges—the control program 8 will ignore the frequency ranges from 2 ... 29.999 and from 88.01 ... 1000 MHz, all frequency tuning will only be performed in the channel pattern of 25 kHz, only those IF-filters will be selected which are closest to the bandwidth of 8 kHz, and only the demodulator for the FM modulation mode will be actuated.

Search

Which parameters of the transmitters are to be measured will be recognized by the control program 8 on account of all display windows which the user has opened and actuated for the display of current measurement results by positioning, for instance, the cursor 10 on the window frame and depressing the key "display area" 15.

If the user initially, for instance, has only opened the display space "panorama" 19 and activated it for outputting measurement values, the control program 8 will recognize thereby that the parameters "level" have to be measured via "frequency".

Figure 5:
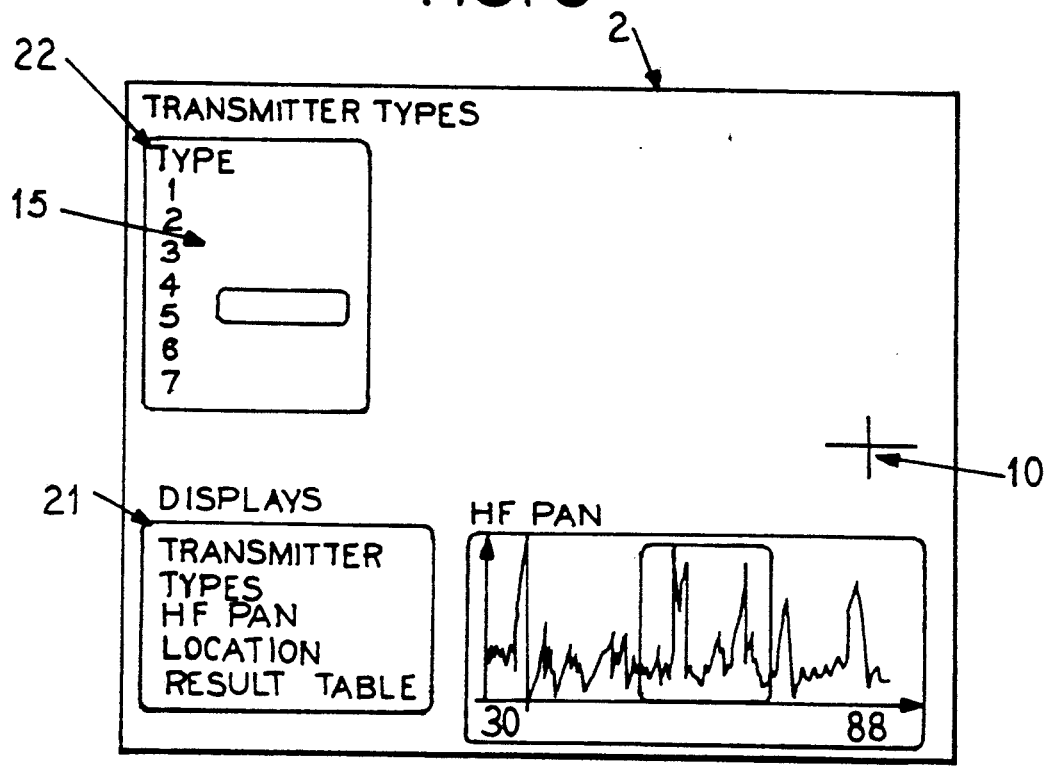
Figure 6:
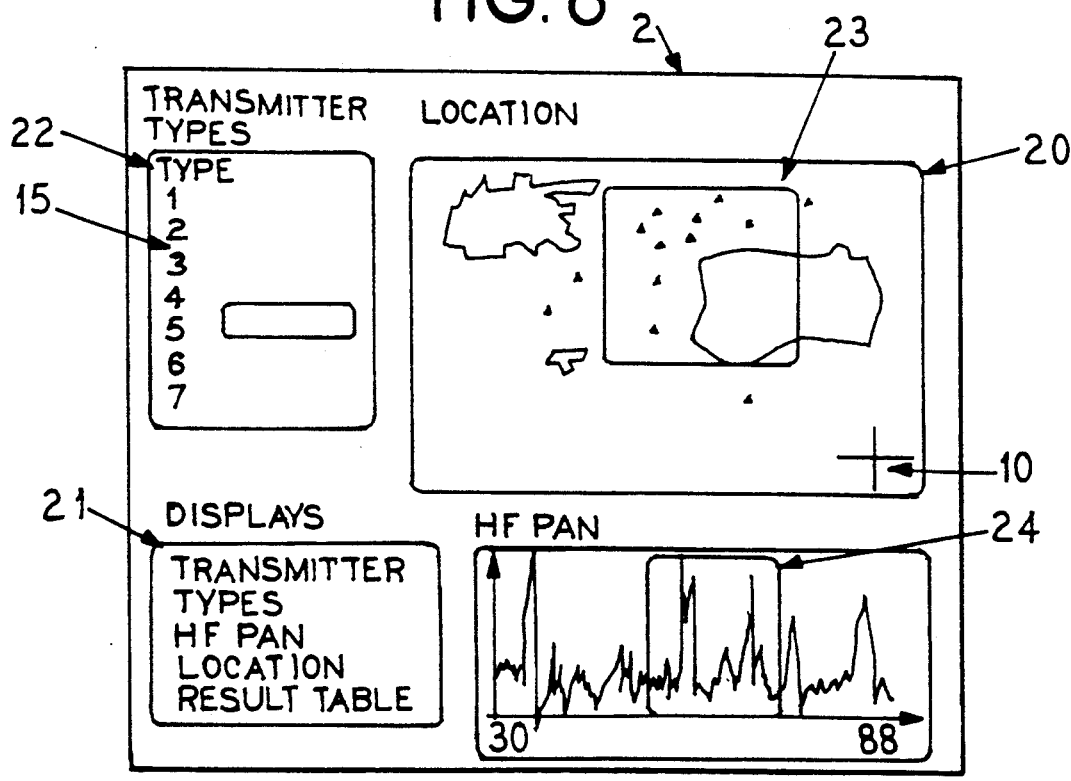

After opening and activation the control program 8 offers the display 19 as shown in FIG. 5 (still without measurement results, however) and scales it to the currently valid measurement range which corresponds to that of the transmitter type 3.

Now, the control program 8 reads from the detection device memory 17 what devices are available to it and finds that both the direction finders (3, 4) and the monitoring receiver 5 are capable of measuring the parameter "level" via "frequency".

Thereupon the control program 8 will split the frequency range onto these three devices and control them in such a way that they will measure only this parameter.

The control program 8 then files the measurement results of the direction finders 3 and 4 and of the monitoring receiver 5 in the result memory 18 for purposes of analysis and displays these results in the HF-panorama 19 as illustrated in FIG. 5.

Position

In the example, the user now wants a display of the position of transmitters which transmit in a frequency subrange. To limit the frequency range, the user by means of the cursor control in the "HF panorama" 19 defines a restricted space 24 and depresses the key "measurement range" 14. This indicates to the control program 8 that the measurement range is to be further restricted to this frequency range.

For displaying the positions, he opens the display window "position" 20 and activates it for outputting current measurement values, whereby the control program 8 recognizes that in addition to the parameter "level" it is required to determine the parameter "position".

To this end it reads out from the detection device memory 17 which of the devices are suitable for determining this parameter, and it finds that the direction finders 3 and 4 each must measure the parameter "azimuth" in synchronism, and that the monitoring receiver 5 cannot be used for this function.

The program further reads out that the parameter "frequency" is required for determining the parameter "azimuth". Now, the control program 8 will cause the direction finders 3 and 4 to search the restricted frequency range in synchronism and to supply all bearings, from which the respective positions are determined and displayed in the display "position" 20.

As the display "HF panorama" 19 is still activated, the control program 8 will display the levels of all measured transmitters in this display and will also cause the monitoring receiver 5 to continue to search signals and to measure levels in the restricted frequency range. The results will continue to be filed in the result memory 18.

Analysis

If the user now wants to compare the current results with previous ones, he only has to open the window "result files" whereupon the control program 8 presents him with a table of contents of the stored results.

He may now fetch certain results from this memory, which are displayed by the control program 8 like the current results, but in such a way that they can be distinguished therefrom, for example by a different color.

Definition of a New Transmitter Type

Let us assume that the user has recognized a new transmitter type with a band of frequencies of its own and he wants to transfer it to the transmitter type-memory 16.

To this end he again indicates in the display "panorama" 19 by means of the cursor control 11 the frequency range of this new transmitter type and depresses the key "transmitter type" 13, and the control program 8 then creates a new record including these frequency limits in the transmitter type memory 16.

Figure 7:
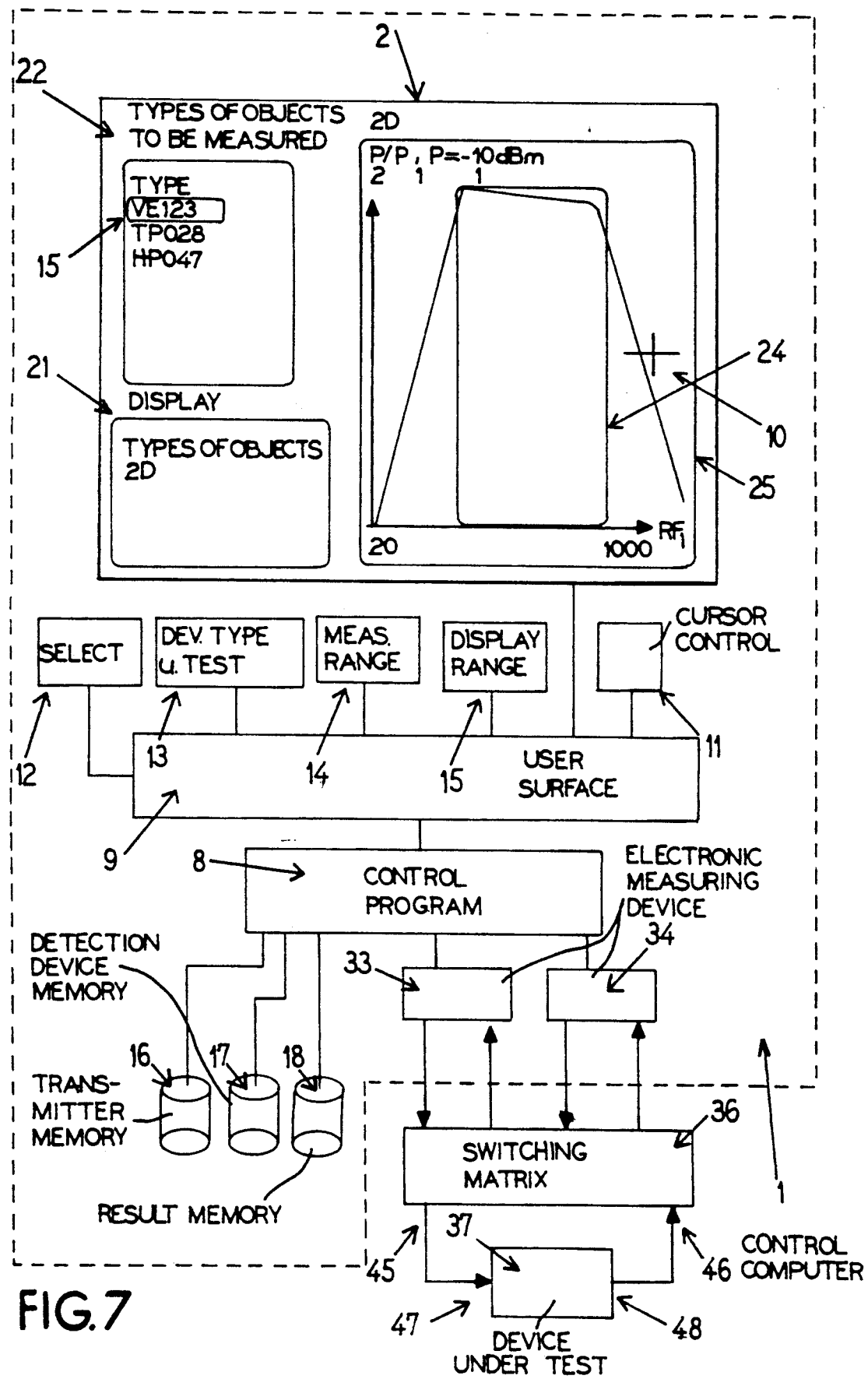
FIGS. 7 to 13 illustrate the use of an apparatus according to the invention with an electronic measuring equipment.

FIG. 7 illustrates the use of the apparatus according to the invention with an electronic measuring equipment comprising two different electronic measuring devices 33 and 34, which are again operatively linked with the control computer 1 and adapted to be remote-controlled thereby.

These measuring devices are connected to a switching matrix 36 through which a device under test 37 can be connected in a predetermined way to these measuring devices 33 and 34. As in the embodiment of FIG. 2, corresponding parts of the control computer 1 are indicated by the same reference characters, and in this case all data of the measuring devices 33 and 34 are stored in the memory 17, whereas in the instant embodiment the memory 16 for the type of device under measurement stores all types of devices under measurement which can be measured with the system together with their measurable parameters and the parameter limit values. As an example, the memory 17 has stored therein:

| Measuring device: | | System | FSAS | UPA |
|---|---|---|---|---|
| parameter $RF_1$: | | | | |
| min: | [MHz] | 1.00E-5 | 0.10 | 1.00E-5 |
| max: | [MHz] | 1800 | 1800 | 0.10 |
| adapter: | | | FSAS-X1 | UPA-X1 |
| parameters required: | | | none | none |
| parameter $P_1$: | | | | |
| min: | [dBm] | −100 | −100 | −67 |
| max: | [dBm] | 10 | −5 | 10 |
| adapter: | | | FSAS-X1 | UPA-X1 |
| parameters required: | | | $RF_1$ | $RF_1$ |
| parameter $P_2$: | | | | |
| min: | [dBm] | −145 | −145 | −87 |
| max: | [dBm] | 33 | 30 | 33 |
| adapter: | | | FSAS-X2 | UPA-X2 |
| parameters required: | | | $RF_1$ | none |
| parameter $RF_2$: | | | | |
| min: | [MHz] | 1.00E-5 | 0.10 | 8.00E-6 |
| max: | [MHz] | 1800 | 1800 | 0.25 |

-continued

| adapter: | | FSAS-X2 | UPA-X2 |
|---|---|---|---|
| parameters required: | $RF_1$ | none | |

| matrix: | connected device: | wiring: |
|---|---|---|
| M-X1 | FSAS-X1 | fixed |
| M-X2 | FSAS-X2 | fixed |
| M-X3 | UPA-X1 | fixed |
| M-X4 | UPA-X2 | fixed |
| M-X5 (45) | input of device under test | by user |
| M-X6 (46) | output of device under test | by user |

Operation of the user surface for the measuring system is identical with that of the radio detection system.

A display such as, for example, "2D-graphics" may be fetched by clicking on the corresponding name in the list, whereupon the control program presents the corresponding diagram without, however, any legend on the coordinate axes.

The user may now provide the coordinate axes with legends by clicking on the corresponding field and inserting a measuring parameter or an equation with measuring parameters.

A display provided in this way with legends and with a new name can be stored for future use together with the legends on its axes.

Start of Operation

Figure 8:
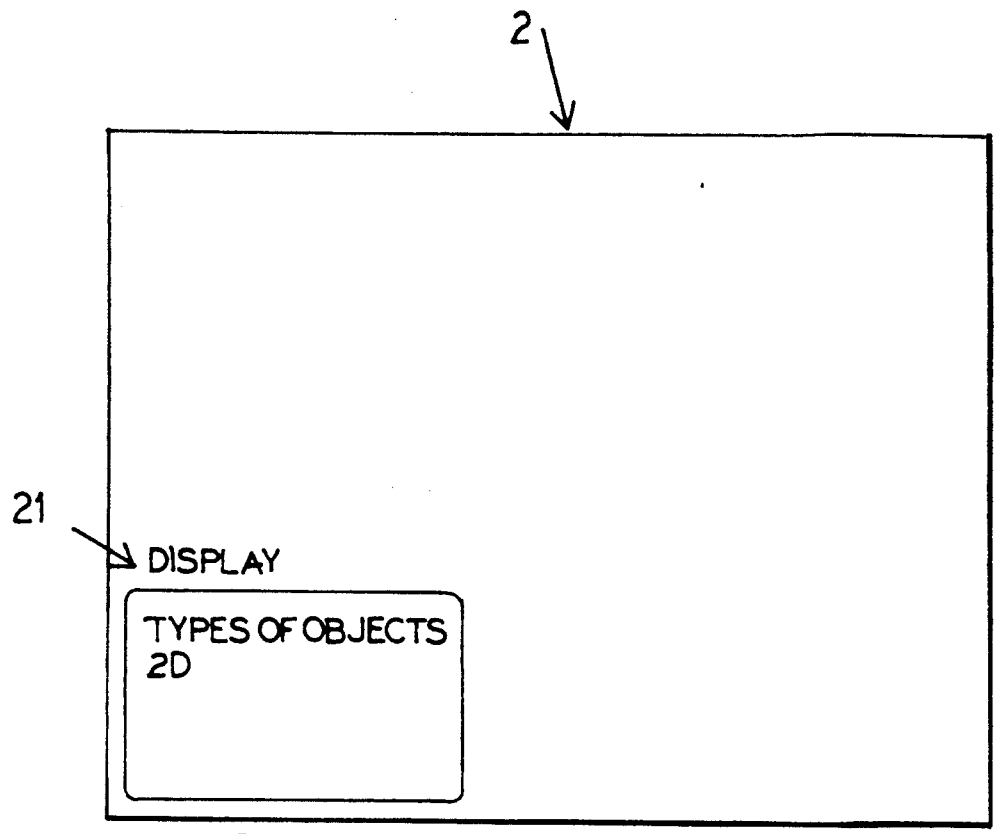

Prior to starting a measuring operation, display 2 (FIG. 8) of the computer 1 presents the user with a table showing the possible display windows such as "types of objects to be measured" and "2D" for two-dimensional display of 2 parameters.

Selection of the Type of Object to be Measured

Figure 9:
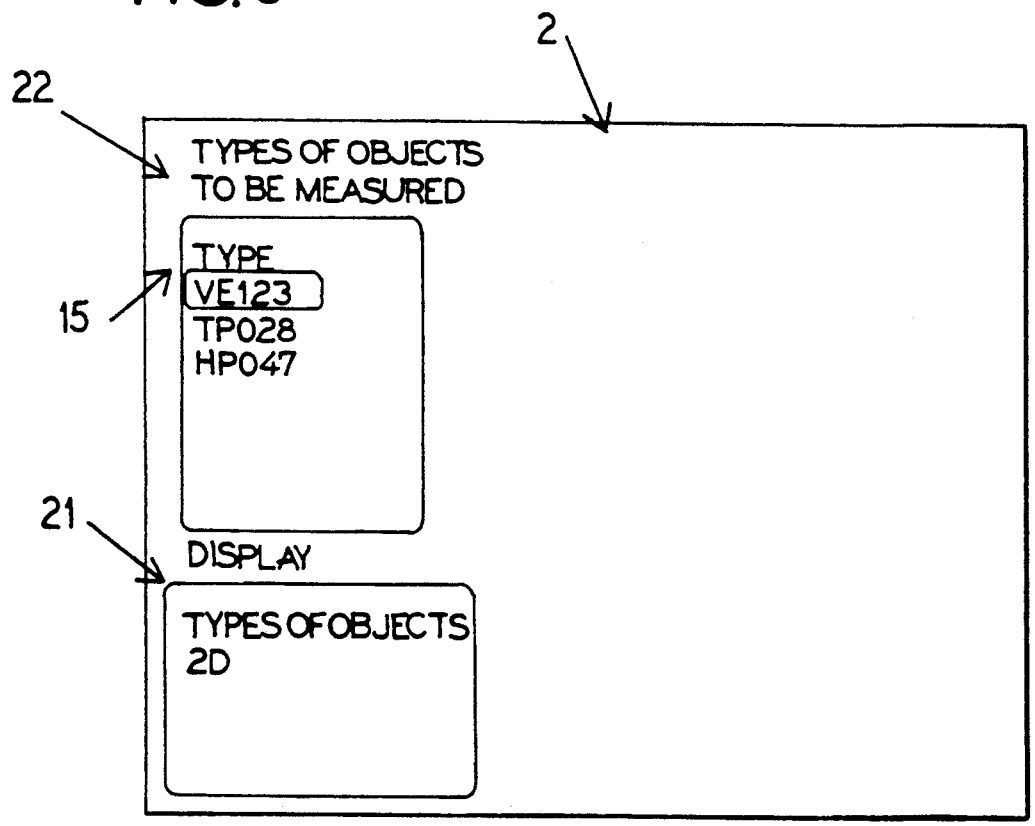

For example, the name "types of objects to be measured" is clicked on in table 21 whereupon the computer presents a list of all types of objects to be measured 22 which are described in the memory 16 (also known herein more generally as an object memory) for the types of objects to be measured, in the present case as an example an amplifier with the type designation VE 123, a high-pass filter and a low-pass filter with the type designations TP 028 and HP 051, respectively (FIG. 9).

In respect of the individual types of objects to be measured the memory 16 therefor comprises the following data which have been collected, for instance, from manufacturers' specifications or other sources and written into the memory for the types of objects to be measured:

| | | VE 123 amplifier | TP 028 lowpass | HP 047 highpass |
|---|---|---|---|---|
| input port: | | 1 | 1 | 1 |
| measuring or settable parameters, input of measured device: | | | | |
| $P_{1min}$: | [dBm] | −174 | −174 | −174 |
| $P_{1max}$: | [dBm] | 0 | 10 | 10 |
| $RF_{1min}$: | [MHz] | 20 | 0 | 0 |
| $RF_{1max}$: | [MHz] | 1000 | 1000 | 1000 |
| output port: | | 2 | 2 | 2 |
| measuring or settable parameters, output of measured device: | | | | |
| $P_{2min}$: | [dBm] | −174 | 0 | 0 |
| $P_{2max}$: | [dBm] | 20 | 10 | 10 |
| $RF_{2min}$: | [MHz] | 20 | 0 | 100 |

-continued

|  | | VE 123 amplifier | TP 028 lowpass | HP 047 highpass |
|---|---|---|---|---|
| $RF_{2max}$: | [MHz] | 1000 | 30 | 1000 |

For example, the user only clicks on the name "VE 123" in the list "types of objects to be measured" 22, and the control program will read the technical data of this amplifier from the memory 16 for the types of objects to be measured.

By this selection the measurable parameters and measuring ranges are pre-defined, and it is also predetermined which port is the input port for signals and which one is the output port:

|  |  | VE 123 amplifier |
|---|---|---|
| input is port: |  | 1 |
| measuring or settable parameters. input of measured device: | | |
| $P_{1min}$: | [dBm] | −174 |
| $P_{1max}$: | [dBm] | 0 |
| $RF_{1min}$: | [MHz] | 20 |
| $RF_{1max}$: | [MHz] | 1000 |
| $Ph_{1min}$: | [rad] | not specified |
| $Ph_{1max}$: | [rad] | not specified |
| output is port: | | 2 |
| measuring or settable parameters. output of measured device: | | |
| $P_{2min}$: | [dBm] | −174 |
| $P_{2max}$: | [dBm] | 20 |
| $RF_{2min}$: | [MHz] | 20 |
| $RF_{2max}$: | [MHz] | 1000 |
| $Ph_{2min}$: | [rad] | not specified |
| $Ph_{2max}$: | [rad] | not specified |

The control program recognizes that the frequency bands of from 0 ... 19.9 and above 1000 MHz should be ignored.

Measurement

In the example, the user is interested in the transient response characteristic of the amplifier, i.e. $P_2/P_1$ as dependent on the frequency $RF_1$. Several ways of informing the control program 8 accordingly are conceivable: for instance the control program 8 could present the user with a list of display windows for parameters, or it might offer the possibility of writing the designations of the parameters to be displayed in a table, whereafter the program reads and interprets the contents of said table and produces the desired display windows.

Figure 10:
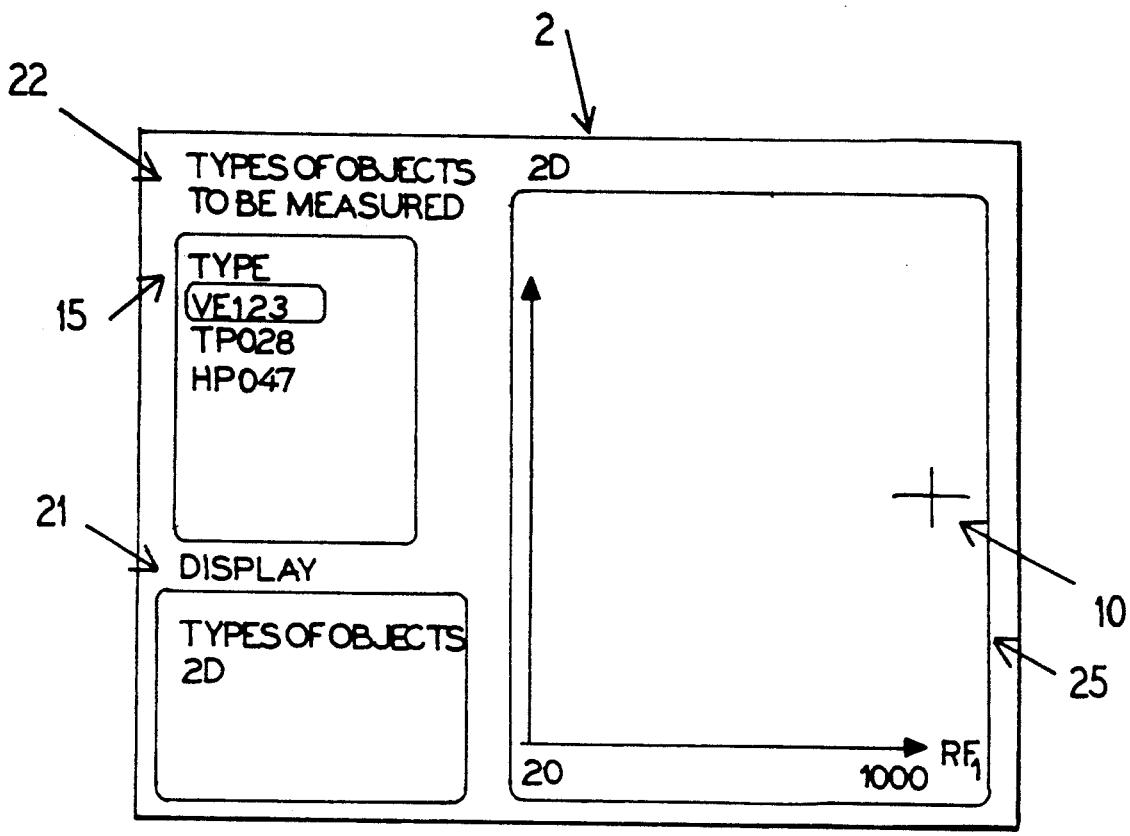
Figure 11:
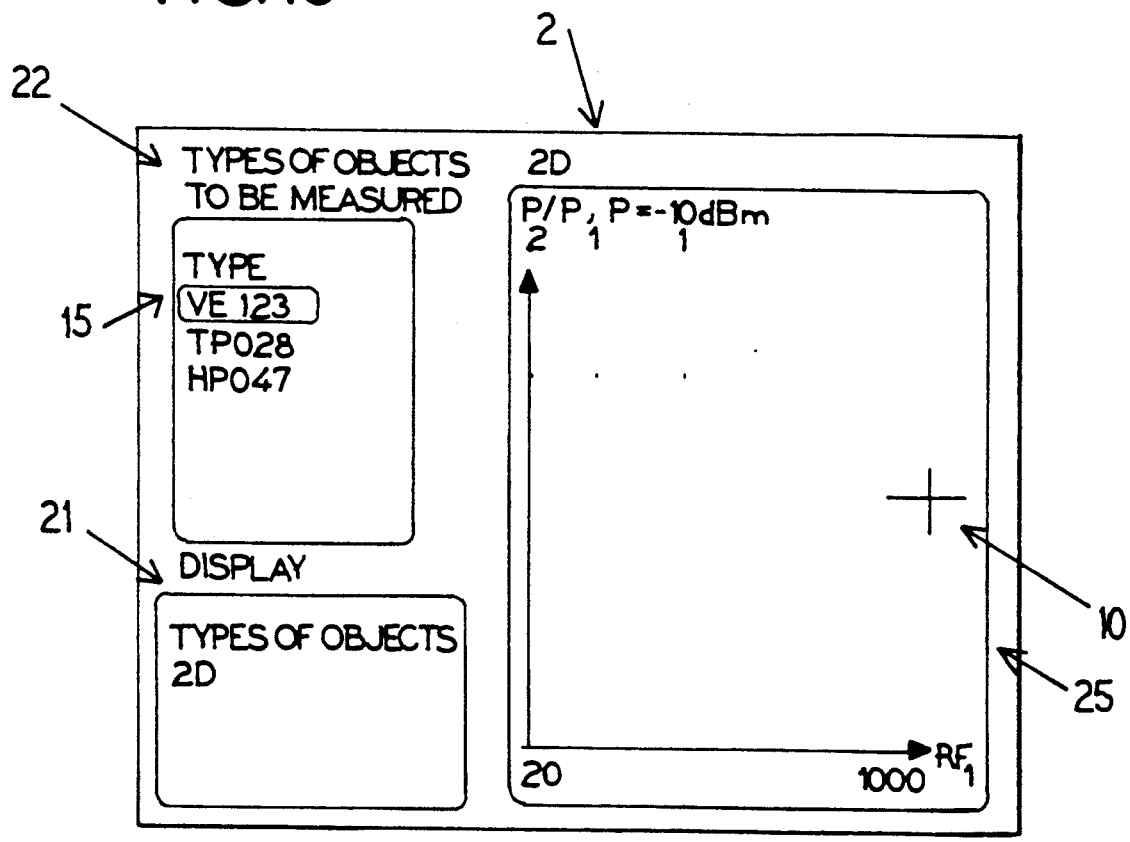

In the present embodiment the user calls a display window "2D" by clicking on its name in the list 21, whereupon the control program 8 presents the display window "2D" 26 (FIG. 10), and he provides the legends for the coordinate axes in the usual way:
the X-axis is provided with the parameter "$RF_1$",
the Y-axis is provided with the equation "$P_2/P_1$, $P_1 = -10$ dBm", which links two parameters with each other and fixes one parameter at a definite value, as shown in FIG. 11.

From the annotation of the coordinate axes the control program now recognizes that the parameters $P_2$ and $P_1$ as dependent on the parameters $RF_1$ are to be measured at the object to be measured and are to be linked with each other.

Initially, the control program scales this display to the range of measurement of 20 ... 1000 MHz, which has been predetermined by the selection of the type of object to be measured.

Now, the user is additionally interested in the transient response characteristic of the amplifier right down to 0.01 MHz and informs the system accordingly by changing, for instance, the scale of the X-axis so that it commences at 0.01 MHz, for which purpose the user depresses the key "range of measurement".

The control program now reads from the memory 17 for storing the measuring devices which of the measuring devices is capable of producing or measuring what parameters within what parameter limits. Here, it is found that
the UPA 33 produces a signal with the parameter $P_1 = -10$ dBm on condition that the parameter $RF_1$ has been set previously.

Also, it is set down in the record that the parameter $RF_1$ for the UPA is limited to the range of up to 100 kHz,
the FSAS 34 also produces a signal with the parameter $P_1 = -10$ dBm from 100 kHz to the desired limit of 1000 MHz.

From the specification for the matrix 36 the control program 8 reads out the following:

| measuring device: port | matrix connected device | wiring |
|---|---|---|
| M-X1 | FSAS-X1 | fixed |
| M-X2 | FSAS-X2 | fixed |
| M-X3 | UPA-X1 | fixed |
| M-X4 | UPA-X2 | fixed |
| M-X5 (45) | input of measured device (47) | by user |
| M-X6 (46) | output of measured device (48) | by user |

Figure 12:
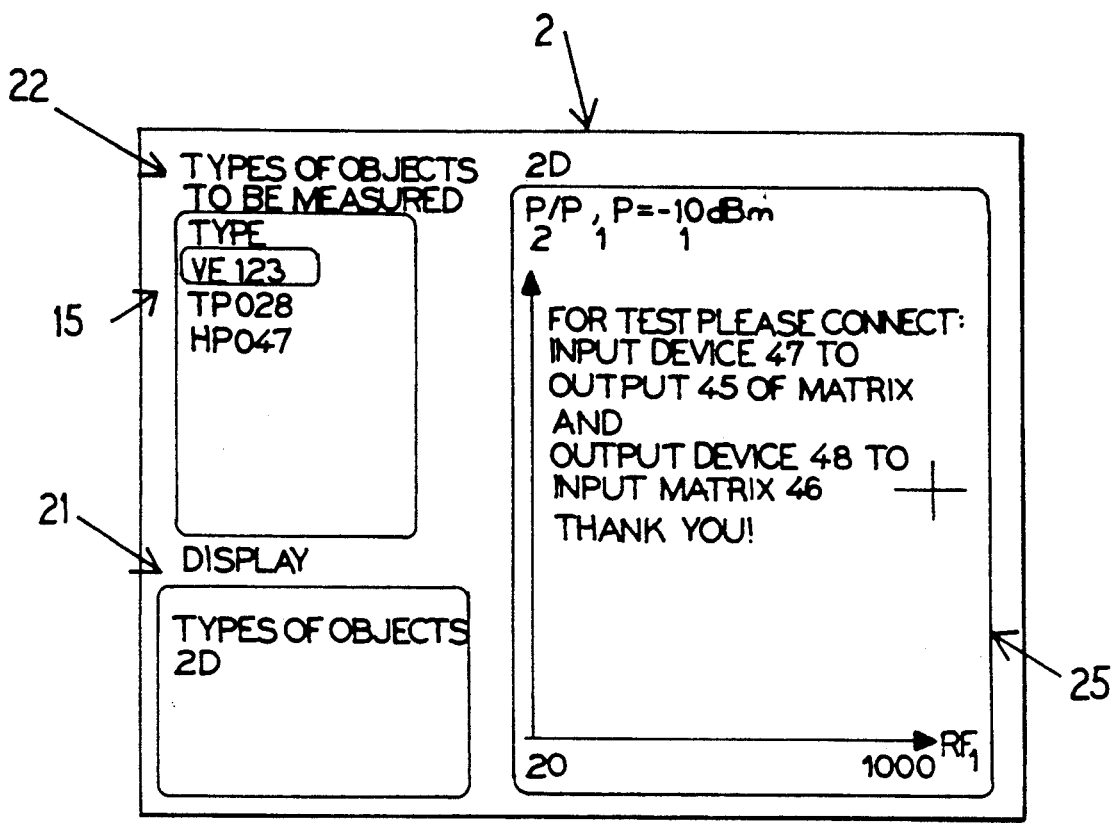
Figure 13:
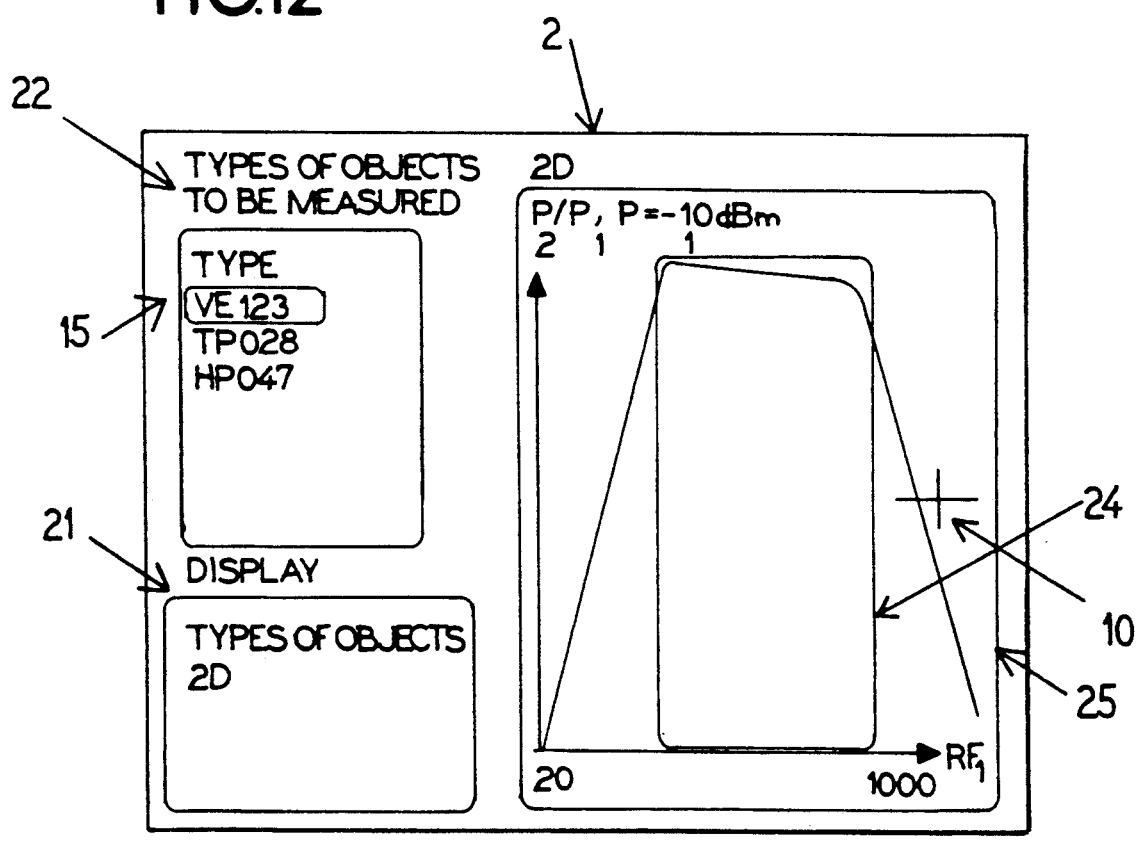

Here, the control program 8 is able to recognize that the user must provide two manual connections, and on the basis of this information the program asks the user to provide the corresponding connections, as illustrated in FIG. 12.

For commencing measurement, the control program 8 will connect the UPA 33 via the matrix 35 to the device 37 to be measured and test the frequency band up to 0.1 MHz, whereafter the FSAS 34 instead of the UPA 33 is connected via the matrix 36 to the device 37 to be measured and the measurements are continued up to 1000 MHz. The results of measurement are filed in the result memory 18 by the control program 8 and simultaneously displayed in the display "2D" 25.

Definition of a New Type of Device to be Measured

When the user by means of the cursor 10 has marked an area of a display such as "2D" 25 and depressed the key "type of device to be measured" 13, the control program 8 recognizes that the user wants to pack a new type of device to be measured into the memory 16 for devices to be measured, and the control program will transfer to the memory 16 for devices to be measured those parameters which correspond to the limits of the marked area 24 as the parameter limits of the new type.

Figure 14:
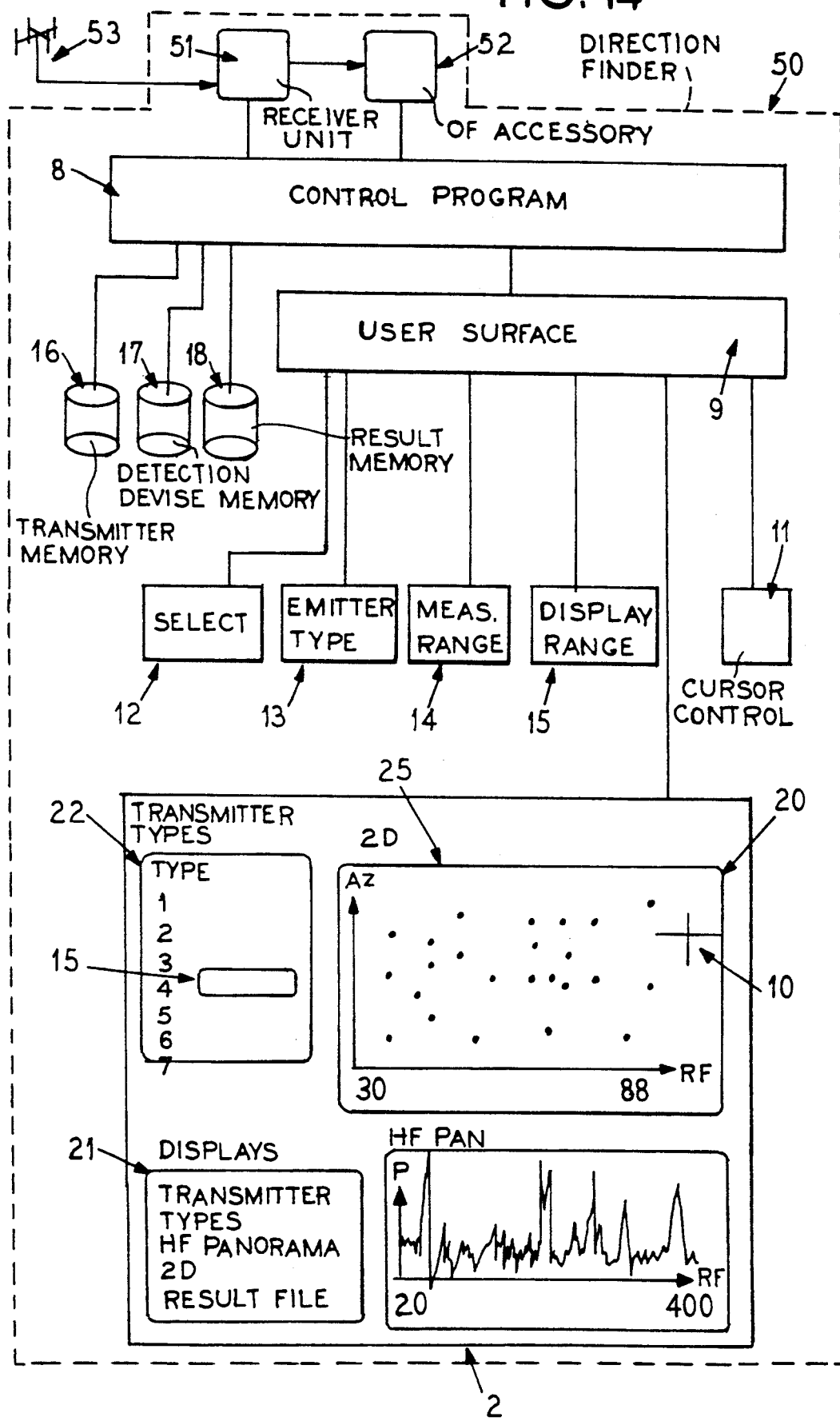
FIG. 14 illustrates the use with a radio direction finder.

FIG. 14 illustrates a direction finder 50 with its essential components, a receiver unit 51 and a DF accessory 52. An antenna 53 can be coupled to the direction finder.

The receiving unit 51 is adapted to be tuned in a frequency range and to measure levels within a very short measuring time, whereas the DF accessory 52 is merely required for determining azimuth values for which, however, it needs a longer measuring time.

The components 51 and 52 are controlled by a control program 8 which communicates with the user via a normal user surface 9 and comprises three memories, viz. a transmitter type memory 16, a component memory 17 and a result memory 18.

The contents are packed into these memories in the same way as in the detection system and may even in part be identical, for instance those of the transmitter type memory.

| Contents of the Transmitter Type Memory 16 | | | | |
|---|---|---|---|---|
| Measurable parameters for all transmitter types: | | | | |
| position: | | yes | | |
| frequency: | | yes | | |
| level: | | yes | | |
| azimuth: | | yes | | |
| content: | | yes | | |
| transmitter type: | unit | type 1 | type 2 | type 3 |
| techn. properties: | | | | |
| min. operating freq.: | [MHz] | 1.50 | 26 | 30 |
| max. operating freq.: | [MHz] | 30 | 46 | 88 |
| smallest freq. step: | [kHz] | 0.10 | 12.50 | 25 |
| bandwidths: | [kHz] | 0.15 | 8 | 8 |
| modulation modes: | AM, USB, LSB | | AM, FM | FM |
| transmitter type: | | type 4 | type 5 | type 6 |
| techn. properties: | | | | |
| min. operating freq.: | [MHz] | 88 | 116 | 225 |
| max. operating freq.: | [MHz] | 107 | 156 | 400 |
| smallest freq. step: | [kHz] | 75 | 12.50 | 25 |
| bandwidths: | [kHz] | 75 | 8 | 12 |
| modulation modes: | | FM | AM | FM |
| transmitter type: | | type HF | type V | type U |
| techn. properties: | | | | |
| min. operating freq.: | [MHz] | 2 | 30 | 200 |
| max. operating freq.: | [MHz] | 30 | 200 | 1000 |
| smallest freq. step: | [kHz] | 0.10 | 12.50 | 12.50 |
| bandwidths: | [kHz] | 0.10 | 12.50 | 12.50 |
| modulation modes: | | all | all | all |

| Content of the Component Memory 17 | | | |
|---|---|---|---|
| component: | direction finder | receiver unit | DF accessory |
| parameter frequency: | | | |
| minimum frequency: | [MHz] | 20 | |
| maximum frequency: | [MHz] | 200 | |
| minimum resolution: | [kHz] | 1 | |
| maximum setting time: | [s] | 1.00E-3 | |
| bandwidths: | [kHz] | 7.50 | |
| | | 15 | |
| | | 150 | |
| parameters required: | | none | |
| parameter level: | | | |
| modulation modes: | | all | |
| measuring time: | [s] | 2.00E-3 | |
| parameters required: | | frequency | |
| parameter azimuth: | | | |
| modulation modes: | | all | |
| measuring time | [s] | 0.01 | |
| parameters required: | | frequency | |

It is evident from this description that only 2 ms are required for measuring the level while a measuring time of 10 ms is required for direction finding.

The control program of the direction finder 50 also initially offers to the user after the start of operations the list 21 of possible displays from which the user selects, for example, the list 22 of transmitter types, the 2D-display 25 and the panorama 19.

The user provides the coordinate axes of the 2-D display 25 with the parameter legends "Az" for azimuth and "RF", whereas the coordinate axes of the panorama 19 have already been provided with legends. As soon as the user has positioned the cursor 10 on the frame of the two display windows 19 and 20 and has depressed the key "display area" 15, the control program 8 will recognize that the parameters azimuth and level have to be measured via the parameter RF and displayed.

When the user selects a transmitter type from the list of transmitter types 22 and has depressed the key "measuring range" 14, the control program 8 will scale all displays to the parameter limits of this transmitter type.

In the example, the user re-scales the display panorama 19 by plotting the parameter limits of 20 and 400 MHz and respectively depresses the key "measuring range" 14.

The control program 8 now recognizes that from 20 to 30 MHz the level should be measured, from 30 to 88 MHz level and azimuth should be measured, and from 88 to 400 MHz only the level should again be measured.

From the component memory 17 the control program 8 reads out what parameters may be measured by which components, and it is informed that the receiver unit 51 is capable of measuring the level throughout the entire frequency range within a measuring time of 2 ms for each frequency, and that the DF accessory requires a measuring time of 10 ms.

Accordingly, the control program 8 will cause the receiver unit 51 to commence level measuring at 20 MHz at a rate of 2 ms/step, and from 30 MHz upwards the measuring time is extended to 10 ms and the azimuth value is additionally derived from the DF accessory 52.

From 88 MHz upwards the control program 8 will again reduce the measuring time to 2 ms/frequency step.

Although I have described my invention by reference to particular illustrative embodiments thereof, many changes and modifications of the invention may become apparent to those skilled in the art without departing from the spirit and scope thereof. I therefore intend to include within the patent warranted hereon all such changes and modifications as may reasonably and properly be included within the scope of my contribution to the art.

I claim:

1. An apparatus for setting individual different electronic devices of an equipment system for measuring or detecting properties of a selected object, comprising:
    a control computer means cooperating with a device memory and a select-object memory, said control computer means having a display screen;
    the individual electronic devices of the system including technical properties thereof and their settable functions being stored in the device memory, and various types of objects including technical properties thereof being stored in the select-object memory;
    the control computer means, prior to performing desired measurement or detection of an object, initially displaying on the display screen object types with their properties and also possible ways of displaying these object properties so that a user may select therefrom a desired type of object to be measured or detected in a desired way or ways of displaying technical properties thereof; and the control computer means being operatively connected to the individual electronic devices such that, after selection of said desired type of object and said desired way or ways of displaying the technical properties, the control computer means automatically selects appropriate electronic devices of the system, automatically makes the required setting thereof, and subsequently automatically causes the desired measurement or detection to be performed.

2. An apparatus according to claim 1 wherein after selection of the desired type of object and the desired way or ways of display, said computer means displaying said desired way or ways of display together with particular limit values of the selected type of object on the screen, said computer means permitting these limit values to be varied by the user in accordance with the measurement or detection being performed, said computer means only then selecting and setting the corresponding appropriate devices of the system.

3. An apparatus according to claim 1 wherein:

said equipment system comprising a radio detecting system, said individual devices of the system comprising a plurality of different electronic radio detection devices, and said object being measured or detected comprising at least one selected transmitter;

said selected-object memory comprising a transmitter type memory having stored therein various transmitter types capable of being detected by the system including their detectable properties;

said device memory comprising a detection device memory having stored therein the individual radio detection devices of the system including their technical properties and their settable radio detection functions;

said control computer means, prior to commencement of a radio detection operation, initially displaying on the display screen stored transmitter types with their detectable properties together with their possible way or ways of display, said control computer means permitting the user to select therefrom a transmitter type to be detected and desired parameter or parameters and the way or ways of display thereof; and said control computer means being operatively connected to the individual detecting devices such that, after selection of the transmitter type to be detected and the way or ways of display thereof, the control computer means automatically selecting the corresponding suitable detecting devices of the system, automatically performing necessary settings, and subsequently automatically performing a desired radio detection of the selected transmitter type.

4. An apparatus according to claim 1 wherein:

said equipment system comprising a measuring system, said individual electronic device of the system comprising electronic measuring devices, and the desired object being measured or detected comprising a selected object to be measured by one or more of the electronic measuring devices;

said selected-object memory comprising a measured-object memory having stored therein various types of objects to be measured by the measuring system including their measurable parameters;

said device memory comprising a measuring device memory having stored therein the individual measuring devices of the system including their technical properties and their settable measuring functions;

said control computer means, prior to commencement of a measuring operation, displaying on the display screen stored types of objects to be measured with their measurable parameters together with way or ways of display thereof, said control computer means permitting the user to select therefrom not only an interesting type of object to be measured but also way or ways of display which is or are of interest to the user; and said control computer means being operatively connected to the individual measuring devices such that, after selection of the desired object to be measured and the way or ways of display thereof, the control computer means automatically selects suitable measuring devices of the system, automatically performs required settings thereof, and subsequently performs a desired measurement at the selected object to be measured which is connected to the measuring devices.

5. An apparatus according to claim 4 wherein input and output ports of said measuring devices are coupled to a switching matrix means to which the object to be measured can be connected, said switching matrix means being controlled by the control computer means to provide a required connection between the object to be measured and measuring devices being employed to measure the object.

6. An apparatus according to claim 1 wherein a built-in remote control means is provided for connecting the electronic devices to the control computer means.

7. An apparatus for setting individual electronic devices of an equipment system for measuring or detecting properties of a selected object, comprising: a control computer means cooperating with a device memory and a select-object memory, said control computer means having a display screen;

the individual electronic devices of the system including technical properties thereof and settable functions thereof being stored in the device memory, and various types of objects including technical properties thereof being stored in the select-object memory;

the control computer means, prior to performing a desired measurement or detection of an object, initially displaying on the display screen object types and technical properties thereof and also possible way or ways of displaying these object properties so that a user may select therefrom a desired type of object to be measured of detected in a desired way or ways of displaying technical properties thereof; and the control computer means being operatively connected to the individual electronic devices such that, after selection of said desired type of object and said desired way or ways of displaying the technical properties, the control computer means automatically selects appropriate electronic devices of the system, automatically makes a required setting thereof, and subsequently automatically causes the desired measurement or detection to be performed.

8. An apparatus for setting a radio detection system to at least one selected transmitter, said radio detection system being formed of a plurality of different electronic radio detection devices, comprising:

a control computer means connected with a detection device memory and a transmitter type memory, said control computer means having a display screen;

the detection device memory having stored therein radio detection devices of the system including technical properties and settable radio detection functions thereof;

the transmitter type memory having stored therein transmitter types capable of being detected by the system including detectable properties thereof;

said control computer means, prior to commencement of a desired radio detection operation, displaying on the display screen stored transmitter types with detectable properties thereof together with possible way or ways of display thereof, said control computer means permitting a user to select therefrom a transmitter type to be detected and desired parameters and way or ways of display thereof; and the control computer means being operatively connected to the individual detecting devices such that, after selection of the transmitter type of interest and the way or ways of display thereof, the control computer means automatically selects corresponding suitable detecting devices of the system, automatically performs necessary settings, and automatically subsequently performs desired radio detection operation of the selected transmitter type.

9. An apparatus for setting a measuring system to a selected object to be measured, said measuring system being formed of a plurality of different electronic measuring devices, comprising:

a control computer means connected to a measuring device memory and a measured-object memory;

said measuring device memory having stored therein the measuring devices of the system including technical properties thereof and settable measuring functions thereof;

the measured-object memory having stored therein various types of objects to be measured by the measuring system including measurable parameters thereof;

said control computer means, prior to commencement of a measuring operation, displaying on the display screen stored types of objects to be measured with their measurable parameters together with way or ways of display thereof, said control computer means permitting a user to select therefrom not only an interesting type of object to be measured but also way or ways of display which is of interest to the user; and the control computer means being operatively connected to the individual measuring devices such that, after selection of the interesting type of object to be measured and way or ways of display thereof, the control computer means automatically selects suitable measuring devices of the system, automatically performs required settings thereof, and subsequently automatically performs a desired measurement at the selected object to be measured which is connected to the measuring devices.

* * * * *